(12) United States Patent
Shirai et al.

(10) Patent No.: US 8,210,878 B2
(45) Date of Patent: Jul. 3, 2012

(54) ELECTRICAL CONNECTOR

(75) Inventors: Hiroshi Shirai, Saitama (JP); Yoshikazu Hirata, Kanagawa (JP)

(73) Assignee: Tyco Electronics Japan G.K., Kanagawa-Ken (JP)

( * ) Notice: Subject to any disclaimer, the term of this patent is extended or adjusted under 35 U.S.C. 154(b) by 0 days.

(21) Appl. No.: 12/942,592

(22) Filed: Nov. 9, 2010

(65) Prior Publication Data

US 2011/0053420 A1 Mar. 3, 2011

Related U.S. Application Data

(63) Continuation of application No. PCT/JP2009/057847, filed on Apr. 20, 2009.

(30) Foreign Application Priority Data

May 9, 2008 (JP) ................................. 2008-123997

(51) Int. Cl.
H01R 13/66 (2006.01)
(52) U.S. Cl. ................................................. 439/620.21
(58) Field of Classification Search ............. 439/620.01, 439/620.08, 620.21, 620.22
See application file for complete search history.

(56) References Cited

U.S. PATENT DOCUMENTS

| | | | | |
|---|---|---|---|---|
| 5,069,641 A | * | 12/1991 | Sakamoto et al. | 439/620.22 |
| 6,210,232 B1 | * | 4/2001 | Lai et al. | 439/620.08 |
| 6,350,152 B1 | * | 2/2002 | Belopolsky et al. | 439/541.5 |
| 7,153,163 B2 | * | 12/2006 | Lewis et al. | 439/620.11 |
| 7,344,414 B2 | * | 3/2008 | Kuo | 439/620.04 |
| 7,517,251 B2 | * | 4/2009 | Richter | 439/630 |
| 7,708,566 B2 | * | 5/2010 | Sabo et al. | 439/79 |
| 2006/0166556 A1 | * | 7/2006 | Hirata | 439/607 |
| 2007/0149055 A1 | | 6/2007 | Watanabe et al. | |

FOREIGN PATENT DOCUMENTS

| | | |
|---|---|---|
| JP | 11-185885 | 7/1999 |
| JP | 2001-339028 | 12/2001 |
| JP | 3087180 U | 4/2002 |
| JP | 3099411 U | 11/2003 |
| JP | 2006-012667 | 1/2006 |

OTHER PUBLICATIONS

IPR cited in co-pending International Application No. PCT/JP2009/057847, dated Dec. 23, 2010, 2 pages.
Written Opinion of ISA cited in co-pending International Application No. PCT/JP2009/057847, dated Jul. 9, 2009, 5 pages.
International Search Report for co-pending application PCT/JP2009/057847 dated Jul. 7, 2009, 3 pages.

* cited by examiner

*Primary Examiner* — Tulsidas C Patel
*Assistant Examiner* — Travis Chambers
(74) *Attorney, Agent, or Firm* — Barley Snyder

(57) ABSTRACT

An electrical connector, includes a protection circuit for protecting circuits on a circuit board. The electrical connector includes a housing, a plurality of contacts secured to the housing, and a semiconductor device built into the housing. The semiconductor devices include an overvoltage protection device, and the plurality of contacts are grounded through the overvoltage protection device.

15 Claims, 7 Drawing Sheets

F I G. 2
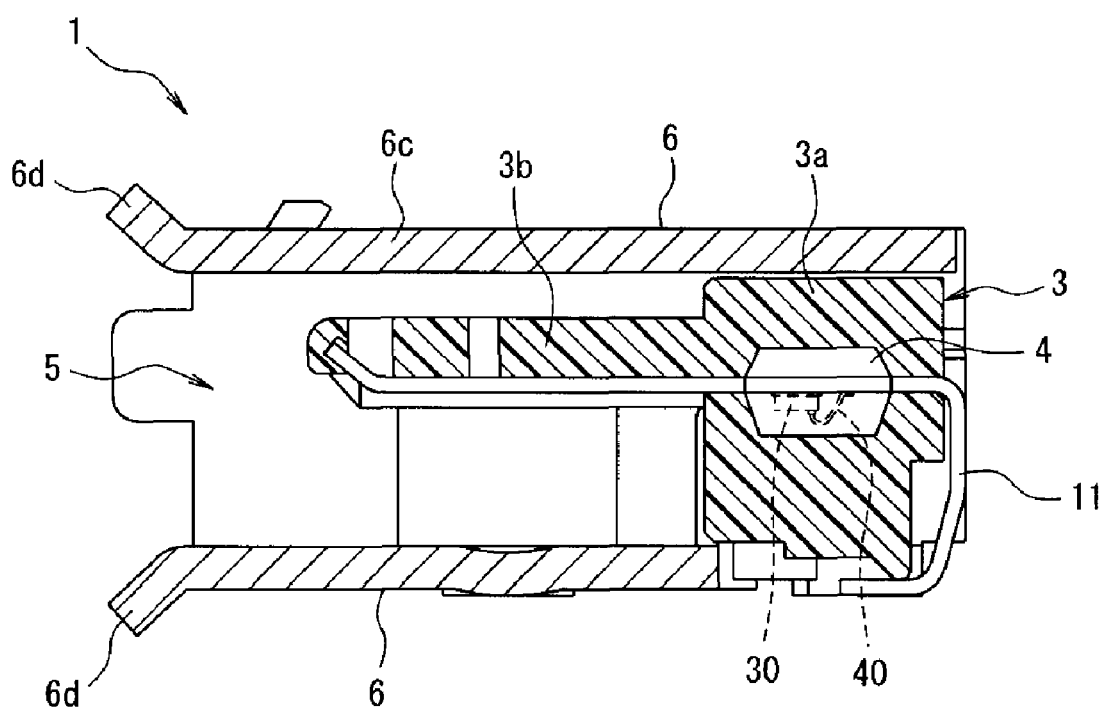

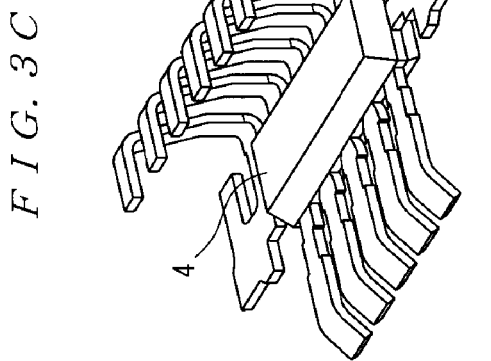
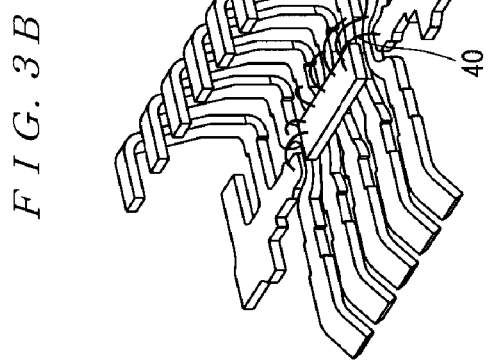
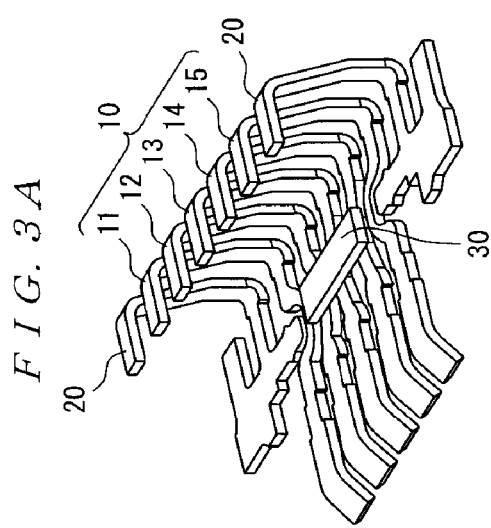
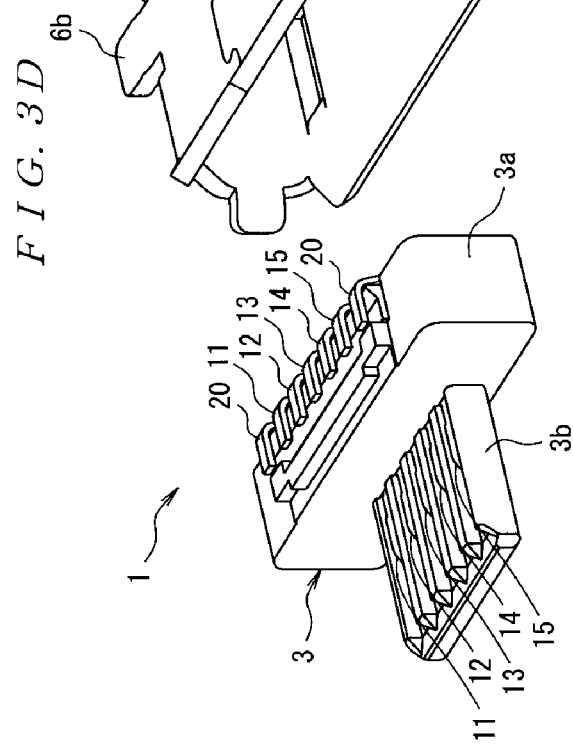

F I G. 7
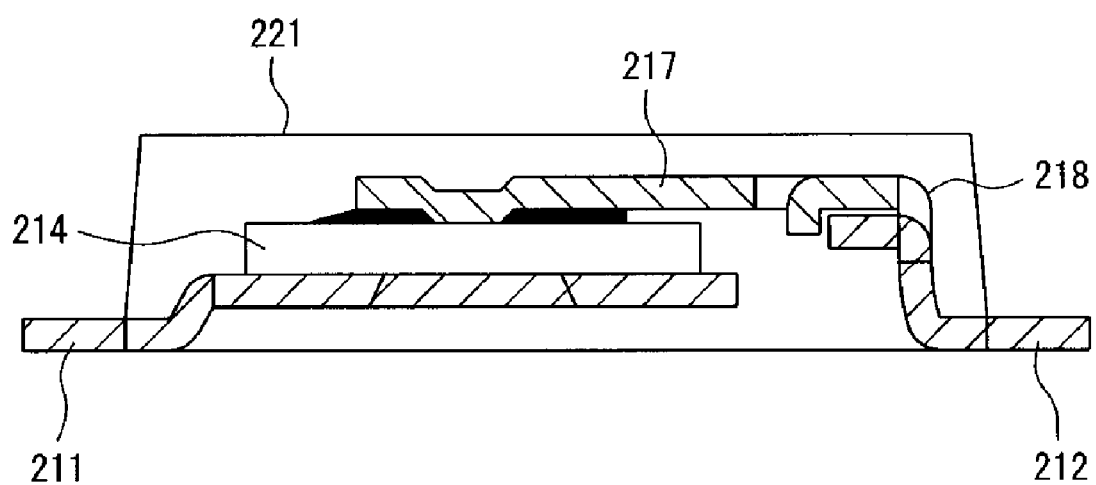

ELECTRICAL CONNECTOR

CROSS-REFERENCE TO RELATED APPLICATIONS

This application is a continuation of PCT International Application No. PCT/JP2009/057847 filed Apr. 20, 2009, which claims priority under 35 U.S.C. §119 to Japanese Patent Application No. JP 2008-123997, filed May 9, 2008.

FIELD OF THE INVENTION

The present invention relates to an electrical connector and in particular to an electrical connector with a built-in semiconductor device.

BACKGROUND

In order to prevent breakdown of a circuit on a circuit board when excess current flows from a mating connector through a connector mounted on the circuit board, a circuit protection element is generally provided between the connector and the circuit on the circuit board. However, if this circuit protection element is mounted on the circuit board, it is difficult to secure space for mounting other electric circuits or elements on the same circuit board so that there are still problems left in high-density mounting on circuit boards.

As a result, electrical connectors having built-in circuit protection devices were developed, and disclosed in Japanese Patent JP H11-185885 and Japanese Patent Application JP 2001-339028 A.

An electrical connector shown in FIG. 6, and disclosed in Patent JP H11-185885, protects circuits on a circuit board on which the electrical connector is mounted from breakdown due to excess current. This electrical connector in the embodiment shown includes a bus bar 123, contacts 125A and 125B, and overcurrent protection devices 124 provided within a housing (not illustrated in the drawing), as shown in FIG. 6. The bus bar 123 has branch terminals 123A and 123B within the housing. The contacts 125A and 125B make contact with respective mating contacts of a mating connector. The overcurrent protection devices 124 are arranged between the branch terminals 123A and 123B and between the contacts 125A and 125B, respectively.

Meanwhile, a connector-type semiconductor device shown in FIG. 7, and disclosed in JP 2001-339028, includes a semiconductor chip 214, which is soldered to a first lead 211 and a terminal (connector 217), sealed in an package 221. By inserting a second lead 212 to connect between a pair of connector pegs 218 provided on the connector 217, the first lead 211 and the second lead 212 are connected to each other via the semiconductor chip 214.

However, since the multiple contacts 125A and 125B are not mutually insulated, the electrical connector disclosed in JP H11-185885 is limited to only applications that use these segments in common functionality, and thus flexibility of circuit formation is low. Namely, since the multiple contacts 125A and 125B are connected as a circuit, and voltage throughout the circuit is thus the same, they can only be applied as a dedicated electrical connector for overcurrent protection for power branching etc. Moreover, since the connector-type semiconductor device disclosed in JP 2001-339028 has a structure in which the second lead 212 is inserted between the pair of connector pegs 218 to connect them, space within the small connector for receiving a multi-position circuit cannot be ensured.

SUMMARY

Accordingly, the invention has been made to solve the above problems, and an objective of the present invention, among others, is to provide an electrical connector with higher flexibility of a protection circuit, which protects circuits on the circuit board, which allows higher circuit integration on a circuit board when having multi-position contacts.

The electrical connector includes a housing, a plurality of contacts secured to the housing, and a semiconductor device built into the housing. The semiconductor devices includes an overvoltage protection device, and the plurality of contacts are grounded through the overvoltage protection device.

BRIEF DESCRIPTION OF THE DRAWINGS

The invention is described in more detail in the following with reference to the embodiments shown in the drawings. Similar or corresponding details in the Figures are provided with the same reference numerals. The invention will be described in detail with reference to the following figures of which:

FIG. 2 is a cross-sectional view of the electrical connector according to the invention, cut along line 2-2 of FIG. 1C;

FIG. 3A is a perspective view of a manufacturing step of the electrical connector of FIG. 1;

FIG. 3B is a perspective view of another manufacturing step of the electrical connector of FIG. 1;

FIG. 3C is a perspective view of another manufacturing step of the electrical connector of FIG. 1;

FIG. 3D is a perspective view of another manufacturing step of the electrical connector of FIG. 1;

FIG. 7 is sectional view of another known electrical connector.

DETAILED DESCRIPTION OF THE EMBODIMENT(S)

Figure 1:
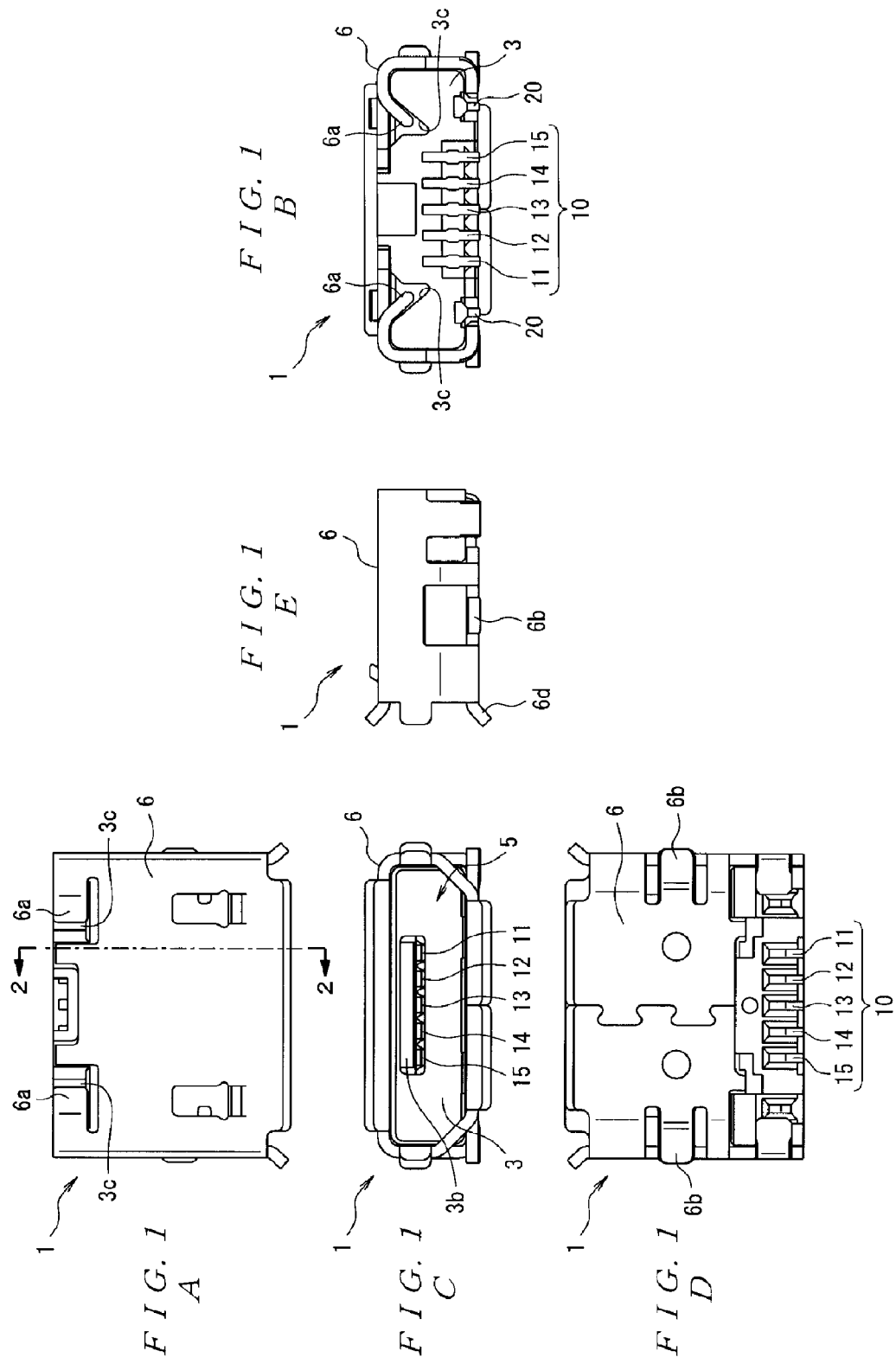
FIG. 1A, is a plan view of an electrical connector according to the invention.
FIG. 1B is a rear view the electrical connector according to the invention.
FIG. 1C is a front view of the electrical connector according to the invention.
FIG. 1D is a bottom view of the electrical connector according to the invention.
FIG. 1E is a right side view of the electrical connector according to the invention.

Hereafter, an embodiment of the present invention will be described with reference to the drawings.

An electrical connector 1 has a housing 3, contacts 10, ground terminals 20, and a shell 6, as shown in FIG. 1A to FIG. 1E. The electrical connector 1 is mounted on a circuit board (not illustrated in the drawing) such that the bottom surface of the electrical connector 1 makes contact with a surface of the circuit board. The contacts 10 and the ground terminals 20 are secured to the housing 3 so as to pass through the housing 3 in the front-and-back direction. The shell 6 is made of sheet metal, and is formed in a cylindrical form so as to cover side surfaces of the housing 3.

As shown in FIG. 1B, the contacts 10 and the ground terminals 20 protruding towards the back surface side of the housing 3 are bent, routed around to the bottom surface of the housing 3, and connected to conductive pads (not illustrated in the drawing) on the circuit board.

The housing 3 has a rectangular parallelepiped main body 3a partially exposed to the back surface side of the electrical connector 1, and a platform portion 3b extending frontward from the main body 3a, as shown in FIG. 2. The housing 3 is made of an insulating material.

In the embodiment shown in FIGS. 1B, 1C, and 1D, the contacts 10 are include five contacts 11 to 15. The contacts 11 to 15 are formed by stamping sheet metal. In the embodiment shown, contact 11 is provided for power supply, contact 12 is provided for identification data communication, contacts 13 and 14 are provided for signals (e.g., for differential transmission signals), and contact 15 is provided for grounding, for example. As shown in FIG. 2, the contacts 11 to 15 are arranged horizontally so as to extend toward the front surface and the back surface of the electrical connector 1. One ends of the respective contacts 11 to 15 are bent to the bottom surface side along the back surface of the housing 3, and connected to respective conductive pads (not illustrated in the drawing) formed on the circuit board. The other ends of the respective contacts 11 to 15 are arranged exposed to the lower side of the platform portion 3b. The other ends of the respective contacts 11 to 15 on the lower side of the platform portion 3b are arranged in a receiving cavity 5, and are electrically connected to respective mating contacts of a mating connector mated with the platform portion 3b.

One ends of the respective ground terminals 20 are bent (see FIG. 1B and FIG. 3A) to the bottom surface side along the back surface of the housing 3 so as to line up with the contacts 11 to 15. Note that the other ends of the respective ground terminals 20 do not need to be formed so as to extend toward the front surface of the electrical connector 1 along with the other ends of the respective contacts 11 to 15. The other ends of the respective ground terminals 20 only need to extend to a position where they are properly connected to the conductive pads on a semiconductor device 30 described later (see FIG. 3A).

As shown in FIG. 1C and FIG. 2, the receiving cavity 5, which receives the mating connector (not illustrated in the drawings) to be mated with the electrical connector 1, is formed by a portion of the shell 6 protruding forward covering the side surfaces of the housing 3. Since the dimension of the shell 6 in the front-and-back direction is longer than that of the main body 3a in the front-and-back direction, a protrusion 6c protruding frontward from the main body 3a is formed on the shell 6. A space is formed between this protrusion 6c and the platform portion 3b. This space is the receiving cavity 5, and is formed in accordance with the shape of the mating part of the mating connector to be mated with the electrical connector 1.

A pair of pegs 6a separated from each other width-wise is formed inwardly bendable on the top surface of the shell 6 on the back surface side. A pair of protrusions 6b is formed on the bottom surface of the shell 6 on respective left and right side ends. These protrusions 6b are surface-mounted and soldered on the conductive pads, which are formed on the circuit board on which the electrical connector 1 is mounted, thereby fixing the electrical connector 1 on the circuit board.

As shown in FIG. 1D and FIG. 1E, peripheral portions 6d on the receiving cavity 5 side of the shell 6 are bent outward so as to facilitate reception of the mating connector into the receiving cavity 5.

Figure 4A:
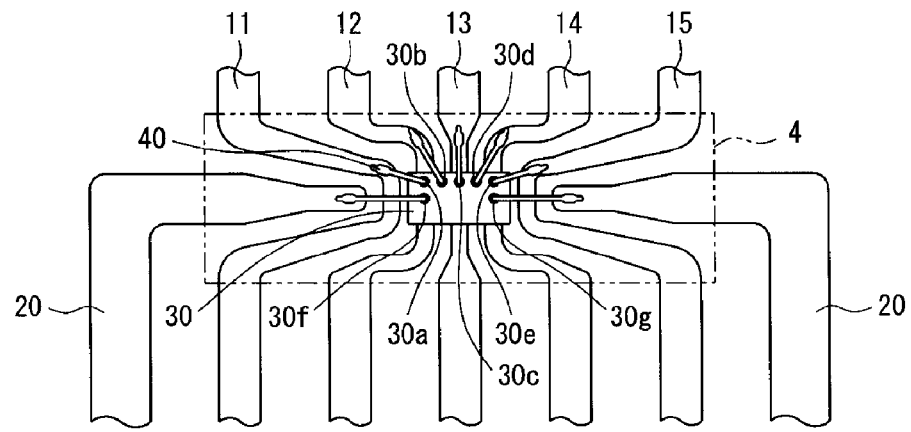
FIG. 4A is a schematic diagram of a connection configuration between a semiconductor device and contacts within a housing according to the invention.

As shown in FIG. 2, the contact 11 (same for the contacts 12 to 15) and the semiconductor device 30 are sealed in an insulating resin package 4. The resin package 4 is sealed in the main body 3a of the housing 3. The contacts 11 to 15 are electrically connected, through bonding wires 40, to multiple conductive pads (not illustrated in the drawing) formed on the semiconductor device 30. More specifically, as shown in FIG. 3B and FIG. 4A, a conductive pad 30a formed on the semiconductor device 30 connects to the contact 11 by a bonding wire 40. A conductive pad 30b formed on the semiconductor device 30 connects to the contact 12 by a bonding wire 40. A conductive pad 30c formed on the semiconductor device 30 connects to the contact 13 a bonding wire 40. A conductive pad 30d formed on the semiconductor device 30 connects contact 14 are connected by a bonding wire 40. A conductive pad 30e formed on the semiconductor device 30 connects to the contact 15 by a bonding wire 40. Conductive pads 30f and 30g formed on the semiconductor device 30 and the respective ground terminals 20 connect to each other by respective bonding wires 40.

Moreover, the conductive pads 30a to 30e formed on the semiconductor device 30 are connected, using respective overvoltage protection devices 51 to 54, to either the conductive pad 30f or the conductive pad 30g, which are also formed on the semiconductor device 30, inside the semiconductor device 30. Namely, the contacts 11 to 15 are electrically connected to the ground terminals 20 using the overvoltage protection devices 51 to 54 formed inside the semiconductor device 30. As mentioned before, since the ground terminals 20 are electrically connected to the ground conductive pads 30f and 30g that are formed on the circuit board on which the electrical connector 1 is mounted, the contacts 11 to 15 are grounded through the overvoltage protection devices 51 to 54. The overvoltage protection devices 51 to 54 may be Zener diodes, for example.

In this manner, connection of the contacts 11 to 15 to the ground terminals 20 allows overvoltage current to be released to the ground terminals 20 when an overvoltage current flows from the mating connector, thereby preventing damage from overvoltage on the circuit on the circuit board.

Hereafter, a method of manufacturing the electrical connector 1 according to the invention will be described with reference to FIGS. 3A through 3D. The method of manufacturing the electrical connector 1 according to the invention has a bonding process, a first sealing process, a second sealing process, and an assembly process.

Figure 5A:
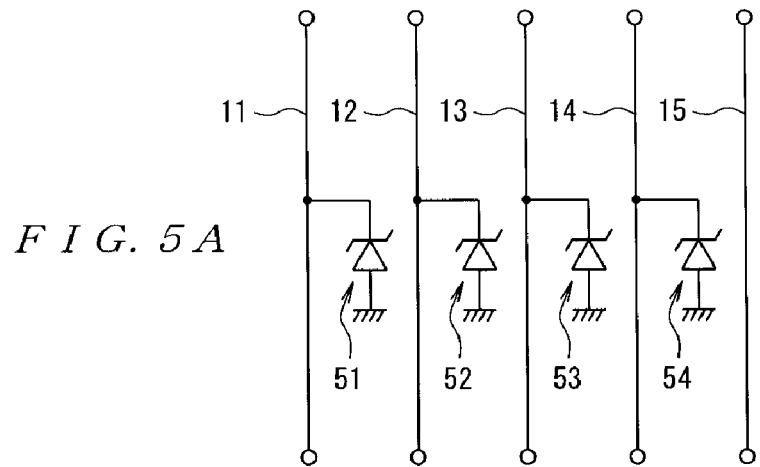
FIG. 5A is a circuit diagram of a circuit built into a semiconductor device according to the invention.

The bonding process is a process in which the conductive pads 30a to 30g formed on the semiconductor device 30 are connected to the contacts 11 to 15 and the ground terminals 20, respectively. First, the contacts 11 to 15 and the ground terminals 20 are formed integrally by stamping sheet metal or the like via a tie bar (not illustrated in the drawings), which links them to keep them from scattering. Then, as shown in FIG. 3A, the semiconductor device 30 covered by an insulating material is mounted on an intermediate portion of the contacts 12 to 14, for example. An insulating sheet may be placed between the semiconductor device 30 and the contacts 12 to 14. One ends of the contacts 11 to 15 and the ground terminals 20 are bent in accordance with shapes of the back surface and the bottom surface of the predesigned housing 3. Next, as shown in FIG. 3B, the respective conductive pads 30a to 30g formed on the semiconductor device 30, are wire bonded to the contacts 11 to 15, and the ground terminals 20 using the bonding wires 40 (see FIG. 4A and FIG. 5A).

The first sealing process, as shown in FIG. 3C, is a process in which the electrically connected semiconductor device 30, the contacts 11 to 15, and the ground terminals 20 are sealed with an insulating material such as resin. In this process, use of a resin sealing apparatus for semiconductor device 30 manufacturing having a pot, a plunger, a runner, a gate, a cavity, an injector, a pump, and the like may be used. The entire semiconductor device 30, the intermediate portion of the contacts 11 to 15, and one ends of the ground terminals 20 are sealed with resin. Once they are sealed with resin, the tie bar linking the contacts 11 to 15 and the ground terminals 20 is cut, and the contacts 11 to 15 and the ground terminals 20 are separated individually. According to this first resin sealing process, the semiconductor device 30, the contacts 11 to 15, and the ground terminals 20 are sealed in the resin package 4, as shown in FIG. 3C.

The second sealing process is a process in which the resin package 4 is further sealed with an insulating material such as resin to form the housing 3, as shown in FIG. 3D. In the second sealing process, as in the first sealing process, use of the resin sealing apparatus for semiconductor device 30 manufacturing is preferable. Note that a cavity used in this process has a shape for forming the main body 3a and the platform portion 3b. As shown in FIG. 3C and FIG. 3D, the resin package 4 is sealed with resin such that one ends of the contacts 11 to 15 and the ground terminals 20 protrude from the back surface side of the main body 3a. Moreover, the resin package 4 is sealed with resin such that the other ends of the contacts 11 to 15 and the ground terminals 20 protrude from the front surface side of the main body 3a. Furthermore, grooves 3c for engaging with the pegs 6a of the shell 6 are formed on the top surface of the main body 3a (see FIG. 1B). The platform portion 3b is formed such that the other ends of the contacts 11 to 15 are arranged on the bottom side of the platform portion 3b. Afterward, as required, the amount of bending is adjusted such that the one ends of the contacts 11 to 15 and the ground terminals 20 make contact with the back surface and the bottom surface of the main body 3a.

The assembly process is a process in which the housing 3 is housed in the shell 6 and the electrical connector 1 is formed such that the receiving cavity 5 is formed on the front thereof. The housing 3 is housed within the shell 6 in the corresponding front-and-back direction. The end surfaces on the back surface side of the shell 6 and the back surface of the housing 3 are aligned with each other at this time. The shell 6 is formed by stamping and forming sheet metal, as shown in FIG. 3D. The shell 6 is opened in the front-and-back direction, and is formed so as to cover, in accordance with the outline of the main body 3a of the housing 3, the side walls thereof. Space is secured in the lower end on the back surface of the shell 6 so that the ground terminals 20 and the contacts 11 to 15, which are bent so as to make contact with the bottom surface of the main body 3a, can make contact with the circuit board. The shell 6 receiving the housing 3 therein has its pegs 6a bent to engage with the grooves 3c formed on the top surface of the housing 3, thereby fixing the housing 3 within the shell 6 (see FIG. 1B).

Figure 4B:
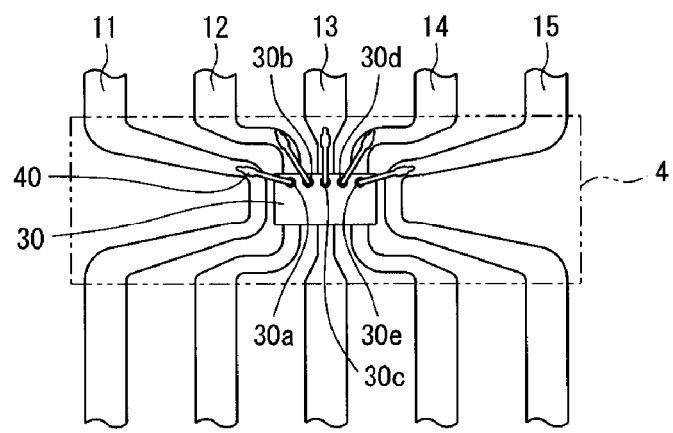
FIG. 4B is a schematic diagram of another connection configuration between a semiconductor device and contacts within a housing according to the invention.
Figure 5B:
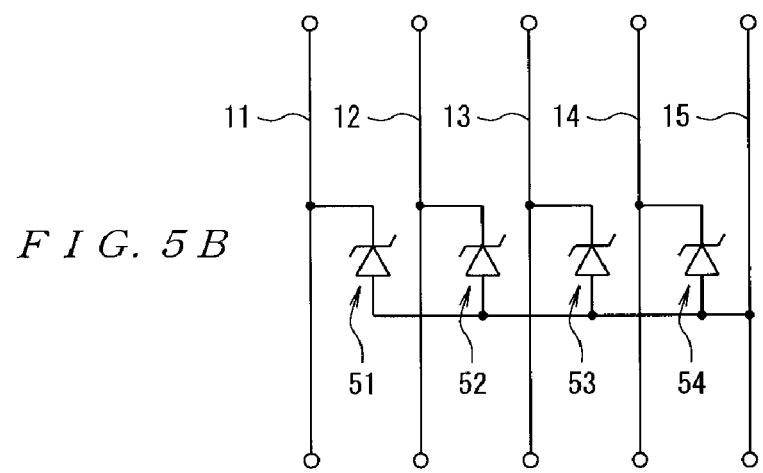
FIG. 5B is another circuit diagram of a circuit built into a semiconductor device according to the invention.

Hereafter, another embodiment of the invention will be described with reference to FIG. 4B and FIG. 5B, which only differs in connection relationship with the semiconductor device 30 and the contacts, however, the description of the same structure given the same reference numerals as in the electrical connector 1 is omitted. As shown in FIG. 4B and FIG. 5B, the electrical connector 1 has any one of the contacts 11 to 15 dedicated to grounding, and uses the ground contact instead of the ground terminals 20. More specifically, when the contact 15 is dedicated to grounding, the conductive pads 30a to 30d and the conductive pad 30e are connected within the semiconductor device 30 through the overvoltage protection devices 51 to 54.

In this manner, use of ground terminals 20 connected to the contacts 10 through the overvoltage protection devices 51 to 54 allows simplification of the configuration of the electrical connector 1, and reduction in manufacturing costs.

Figure 4C:
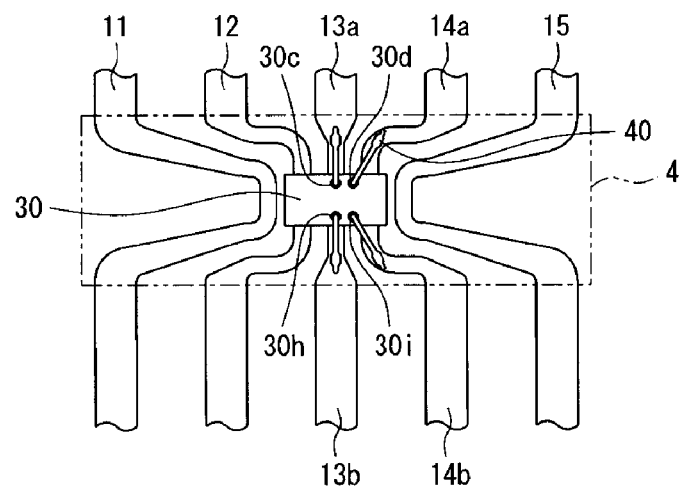
FIG. 4C is a schematic diagram of another connection configuration between a semiconductor device and contacts within a housing according to the invention.
Figure 5C:
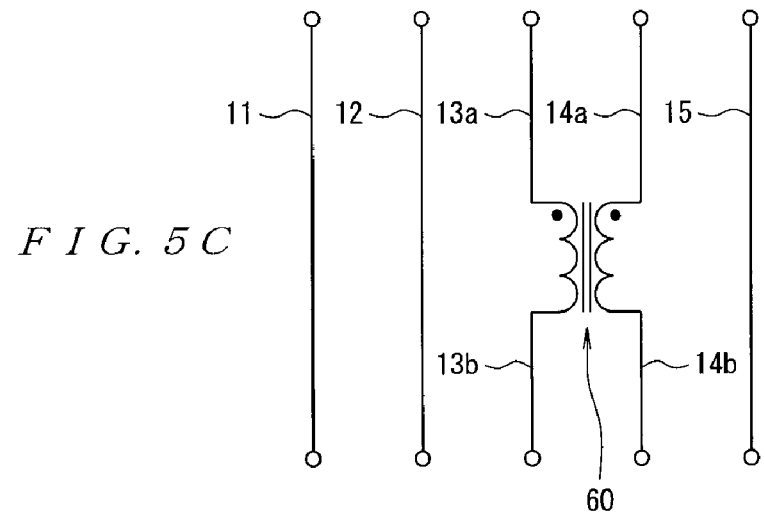
FIG. 5C is another circuit diagram of a circuit built into a semiconductor device according to the invention.
Figure 6:
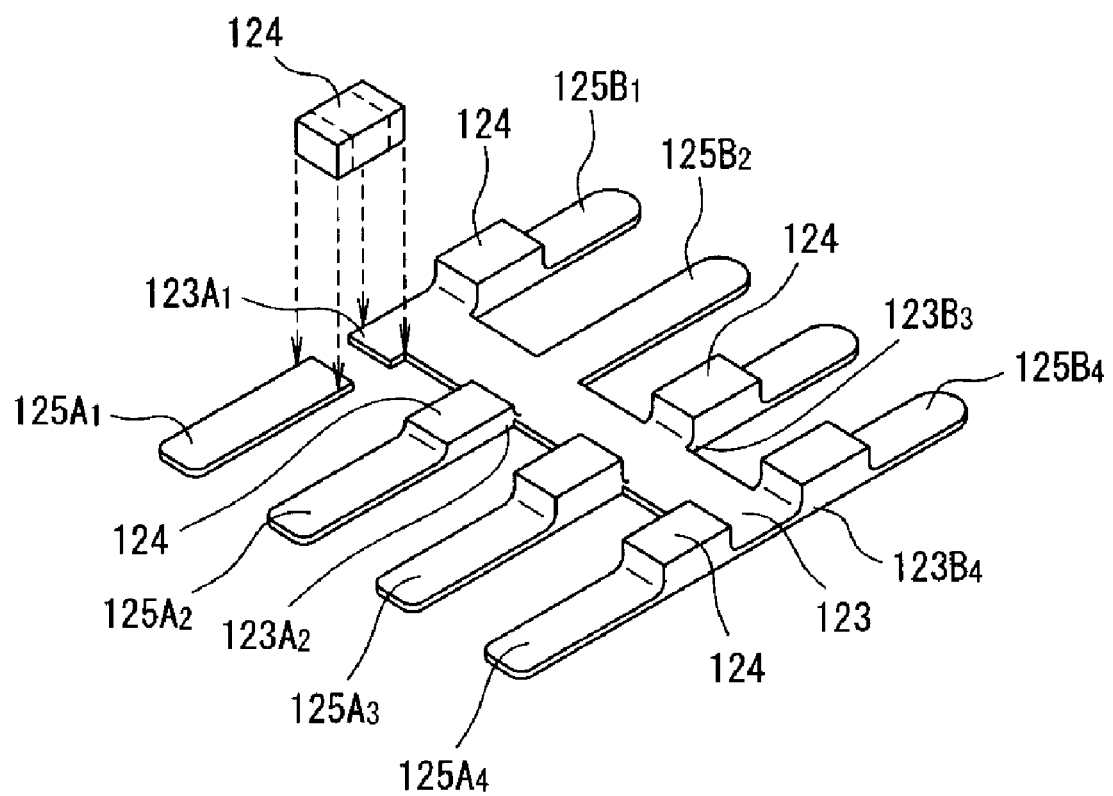
FIG. 6 is a perspective view of a known electrical connector.

Hereafter, another embodiment of the invention will be described with reference to FIGS. 4C and 5C, which only differs in connection relationship between the semiconductor device 30 and the contacts. However, description of the same structure given the same reference numerals as the embodiment previously discussed is omitted. As shown in FIG. 4C and FIG. 5C, the electrical connector 1 has at least one pair of contacts 10 divided into a first contact and a second contact, and connected within the semiconductor device 30 through a preferred circuit. More specifically, for the purpose of reducing common-mode noise between the contacts 13 and 14, a first contact 13a and the conductive pad 30c are first connected by a bonding wire 40. A first contact 14a and the conductive pad 30d are also connected by a bonding wire 40. A second contact 13b and the conductive pad 30h are also connected by a bonding wire 40. A first contact 14b and the conductive pad 30i are also connected by a bonding wire 40. The conductive pads 30c and 30d and the conductive pads 30h and 30i are connected forming a common-mode choke circuit 60 within the semiconductor device 30.

The semiconductor device 30 sealed by the resin package 4 and the contacts 11 to 15 being connected in this manner allows changes in the relative voltage between adjacent contacts, thereby protecting the circuits on the circuit board.

By appropriately setting function of a protection circuit for protecting the circuits on the circuit board and connection mode between the protection circuit and the contacts, an electrical connector 1 having flexibility of the protection circuit but not requiring a large mounting area even with multi-position contacts may be provided.

While embodiments of the invention have been illustrated, the invention is not limited thereto, and various modifications and improvements are possible. For example, while in the embodiments described above, five (five pairs) contacts 10 are used as an example for a micro USB connector, number of the contacts 10 is not limited thereto. For example, number of the contacts 10 may be 19 for a mini HDMI connector, for example. Moreover, connection between the contacts 10 and the semiconductor device 30 is not limited to wire bonding and may be made through wireless bonding, such as flip-chip connecting.

What is claimed is:

1. An electrical connector mountable on a circuit board; the electrical connector comprising:
 a housing;
 a plurality of contacts secured to the housing;
 at least one ground terminal;
 a semiconductor device built into the housing and having an overvoltage protection device; and
 a plurality of conductive pads formed on the semiconductor device;
 wherein the semiconductor device is mounted on at least an intermediate portion of the plurality of contacts and the plurality of conductive pads are wire bonded to the plurality of contacts and the at least one ground terminal using bonding wires, the plurality of contacts are grounded through the overvoltage protection device.

2. The electrical connector according to claim 1, wherein the housing includes a main body partially exposed to a back surface of the electrical connector and a platform portion extending frontward from the main body.

3. The electrical connector according to claim 1, wherein the plurality of contacts and the at least one ground terminal pass through the housing in a front-and-back direction.

4. The electrical connector according to claim 1, wherein the plurality of contacts are arranged horizontally so as to extend toward a front surface and a back surface of the electrical connector.

5. The electrical connector according to claim 1, wherein the plurality of contacts, the at least one ground terminal and other contacts are connected through the overvoltage protection device.

6. The electrical connector according to claim 1, wherein one of the plurality of contacts is grounded.

7. The electrical connector according to claim 1, further comprising a cylindrical shell covering side surfaces of the housing.

8. The electrical connector according to claim 7, further comprising a receiving cavity formed by a portion of the shell protruding forward and covering the side surfaces of the housing.

9. The electrical connector according to claim 1, wherein the plurality of contacts and the at least one ground terminal protrude towards a back surface of the housing and are bent around to a bottom surface of the housing.

10. The electrical connector according to claim 9, wherein an end of the at least one ground terminal is bent so as to line up with the plurality of contacts.

11. The electrical connector according to claim 1, wherein the plurality of contacts and the semiconductor device are sealed in an isolative package.

12. The electrical connector according to claim 11, wherein the package is sealed in the main body of the housing.

13. An electrical connector mountable on a circuit board; the electrical connector comprising:
a housing;
a plurality of contacts secured to the housing;
at least one ground terminal;
a semiconductor device built into the housing and having an overvoltage protection device; and
a plurality of conductive pads formed on the semiconductor device;
an insulating material sealing the semiconductor device;
wherein the semiconductor device is mounted on the plurality of contacts and the plurality of conductive pads are wire bonded to the plurality of contacts and the at least one ground terminal using bonding wires, the semiconductor device and bonding wires being wholly sealed by the insulating material.

14. The electrical connector according to claim 13, wherein an entirety of the semiconductor device, an intermediate portion of the plurality of contacts, and one end of the at least one ground terminal are sealed within the insulating material.

15. The electrical connector according to claim 14, wherein the insulating material is a resin.

* * * * *